(12) United States Patent
Lee et al.

(10) Patent No.: US 8,009,436 B2
(45) Date of Patent: Aug. 30, 2011

(54) INTEGRATED CIRCUIT PACKAGE SYSTEM WITH CHANNEL

(75) Inventors: Myoungho Lee, Ichon (KR); Taegyu Kang, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 319 days.

(21) Appl. No.: 11/380,652

(22) Filed: Apr. 27, 2006

(65) Prior Publication Data
US 2007/0109757 A1   May 17, 2007

Related U.S. Application Data

(60) Provisional application No. 60/594,676, filed on Apr. 28, 2005.

(51) Int. Cl.
*H05K 7/00* (2006.01)
(52) U.S. Cl. ........................... 361/760; 174/260
(58) Field of Classification Search ............... 361/760; 174/250, 255, 260; 29/841, 854, 840
See application file for complete search history.

(56) References Cited

U.S. PATENT DOCUMENTS

| 5,641,996 | A * | 6/1997 | Omoya et al. ............... 257/787 |
| 6,356,453 | B1 * | 3/2002 | Juskey et al. ............... 361/760 |
| 6,562,660 | B1 * | 5/2003 | Sakamoto et al. .......... 438/124 |
| 6,909,178 | B2 | 6/2005 | Sakamoto et al. |
| 6,969,914 | B2 * | 11/2005 | Fuller et al. ............... 257/780 |
| 7,321,099 | B2 * | 1/2008 | Mishiro ..................... 174/260 |
| 7,359,211 | B2 * | 4/2008 | Landeros et al. ........... 361/760 |
| 7,382,628 | B2 * | 6/2008 | Kawamoto et al. ......... 361/764 |
| 2005/0017373 | A1 * | 1/2005 | Nishikawa et al. .......... 257/778 |
| 2007/0235216 | A1 * | 10/2007 | Bae et al. ................... 174/260 |

* cited by examiner

*Primary Examiner* — Yuriy Semenenko
(74) *Attorney, Agent, or Firm* — Mikio Ishimaru

(57) ABSTRACT

An integrated circuit package system provides a substrate and contact pads are formed on the substrate. A channel is formed in the substrate between the contact pads. A circuit component is electrically connected to the contact pads, with the circuit component over the channel. The circuit component, the contact pads, and the channel are encapsulated in encapsulant, the encapsulant flowing into the channel.

20 Claims, 3 Drawing Sheets

INTEGRATED CIRCUIT PACKAGE SYSTEM WITH CHANNEL

CROSS-REFERENCE TO RELATED APPLICATION

This application claims the benefit of U.S. Provisional Patent Application Ser. No. 60/594,676 filed Apr. 28, 2005, and the subject matter thereof is hereby incorporated herein by reference thereto.

TECHNICAL FIELD

The present invention relates generally to integrated circuit packages, and more particularly to a system for encapsulating electronic components.

BACKGROUND ART

In the electronics industry, a continuing objective is to further and further reduce the size of electronic devices while simultaneously increasing performance and speed. Cellular telephones, personal data devices, notebook computers, camcorders, and digital cameras are but a few of the consumer products that require and benefit from this ongoing miniaturization of sophisticated electronics.

Integrated circuit ("IC") assemblies for such complex electronic systems typically have a large number of interconnected IC chips. Photolithographic techniques are used to form the various IC chips, commonly referred to as active and passive components. IC chips are then mounted on a substrate, such as a ball grid array.

The active components are typically secured to the substrate with a layer of adhesive or an adhesive film. The active components are then electrically connected to the substrate by a number of fine, conductive wires, typically gold (Au) or aluminum (Al), that electrically connect the die to the substrate. The wires are attached to the die at the bonding pads of the die, which are located around the periphery of the die.

Passive components are typically secured with solder paste at input/output mounting pads in the substrate. Thus, after reflow, solder electrically connects the passive components to the substrate. Mounting passive components to the substrate leaves a gap under the passive component, between the substrate.

After one or more IC chips are electrically connected to the substrate, the IC chips and the substrate are encapsulated in a mold material, such as plastic or epoxy, or in a multi-part housing made of plastic, ceramic, or metal. The encapsulation protects the substrate and the IC chips from physical, electrical, moisture, and/or chemical damage. The encapsulated product is referred to as the IC assembly and is ready to be incorporated into larger complex electronic systems.

During the encapsulation process, the mold compound is supposed to flow around the active and passive components, filling the gap under the passive component. However as the size of passive components continues to decrease, filling the gap under the passive component becomes an increasing problem. If the gap is not filled with mold compound, processes used to incorporate the IC assembly into larger complex electronic systems, such as ball grid array reflow, can cause the solder from different input/output mounting pads to melt and connect, causing a short circuit or delamination.

Thus, a need still remains for improved encapsulation processes. In view of the ever increasing commercial competitive pressures, increasing consumer expectations, and diminishing opportunities for meaningful product differentiation in the marketplace, it is increasingly critical that answers be found to this problem. Moreover, the ever-increasing need to save costs, improve efficiencies, improve performance, and meet such competitive pressures adds even greater urgency to the critical necessity that answers be found to this problem.

Solutions to this problem have been long sought but prior developments have not taught or suggested any solutions and, thus, solutions to this problem have long eluded those skilled in the art.

DISCLOSURE OF THE INVENTION

The present invention provides an integrated circuit package system. A substrate is provided and contact pads are formed on the substrate. A channel is formed in the substrate between the contact pads. A circuit component is electrically connected to the contact pads, with the circuit component over the channel. The circuit component, the contact pads, and the channel are encapsulated in encapsulant, the encapsulant flowing into the channel.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
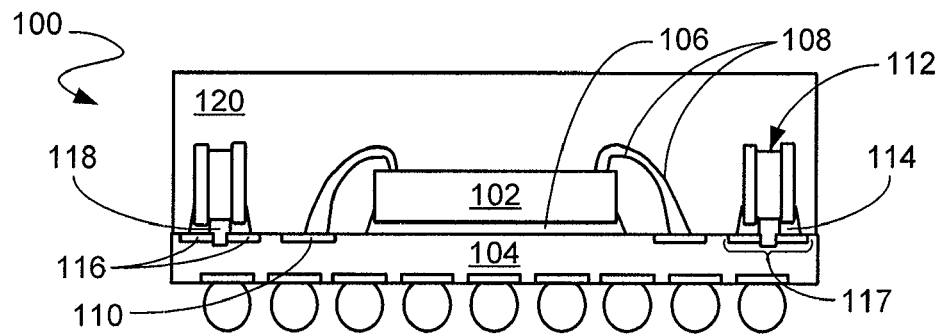
FIG. 1 is a cross sectional view of an integrated circuit package system according to an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits and process steps are not disclosed in detail. Likewise, the drawings showing embodiments of the device are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

For expository purposes, the term "horizontal" as used herein is defined as a plane parallel to the plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Referring now to FIG. 1, therein is shown a cross sectional view of an integrated circuit package system 100 in accordance with an embodiment of the present invention. The integrated circuit package system 100 includes an active component 102, such as a die, attached to a first side of a substrate 104 with an adhesive 106. Wires 108 electrically connect the active component 102 to first side of the substrate 104 at active component contact pads 110. A discrete component 112, such as a resistor, is attached to the first side of substrate 104 with an electrically conductive adhesive 114, such as solder formed from solder paste. The electrically conductive adhesive 114 electrically connects the discrete component 112 to the first side of the substrate 104 at passive component contact pads 116. The passive component contact pads 116 are formed in a discrete contact pair 117 for coupling the discrete component 112. The passive component contact pads 116 formed on the first side of the substrate 104 and beyond the active component contact pads 110. A channel 118, described in greater detail hereinbelow, extends into the first side of the substrate 104 under the discrete component 112 and between the passive component contact pads 116 of the discrete component pair 117. The first side of the substrate 104, the active component 102, the discrete component 112, the adhesive 106, the electrically conductive adhesive 114, the wires 108, the active component contact pads 110, and the passive component contact pads 116 are encapsulated in an encapsulant 120. During encapsulation the encapsulant 120 flows into the channel 118, thus surrounding the discrete component 112 and the electrically conductive adhesive 114.

It has been unexpectedly discovered that the channel 118 will prevent short circuits of the discrete component 112. During the manufacture of the integrated circuit package system 100 the channel 118 ensures that the encapsulant 120 flows under the discrete component 112, thus fully encapsulating the discrete component 112 and removing any air pockets. Without the channel 118, the encapsulant 120 frequently does not flow under the discrete component 112. Thus, a short circuit may occur by allowing the electrically conductive adhesive 114 to bleed together in the air pockets, connecting the passive component contact pads 116. Short circuits can form during manufacture of the integrated circuit package system 100 or during incorporation of the integrated circuit package system 100 into larger systems (not shown).

Figure 2:
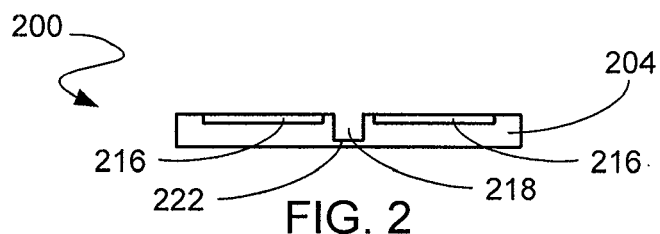
FIG. 2 is a cross sectional view of a simple integrated circuit package system at an early stage of manufacture, taken along line 2-2 in FIG. 3, according to an alternate embodiment of the present invention.
Figure 3:
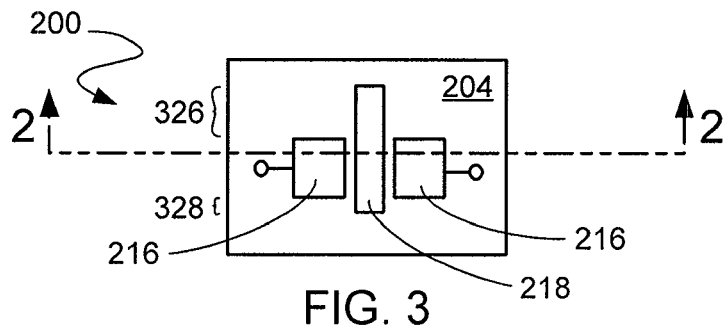
FIG. 3 is a plan view of the simple integrated circuit package system shown in FIG. 2.

Referring now to FIG. 2, therein is shown a cross sectional view of a simple integrated circuit package system 200 in an early stage of manufacture, taken along line 2-2 in FIG. 3, according to an alternate embodiment of the present invention. Processing has formed passive component contact pads 216 and a channel 218 with a bottom 222 in a substrate 204. The channel 218 has been formed to a depth in the substrate 204, such that the bottom 222 of the channel 218 under a passive component 412 (see FIG. 4) will be at a distance 424 (FIG. 4) greater in one embodiment, for example, than 50 μm from the passive component 412 (FIG. 4).

Referring now to FIG. 3, therein is shown a plan view of the simple integrated circuit package system 200. The channel 218 extends a first distance 326 in a first direction and a second distance 328 in a second direction beyond the passive component contact pads 216. The first distance 326 and the second distance 328 allow an encapsulant 520 (FIG. 5) easy access to the channel 218. The first distance 326 can be greater than the second distance 328 to ensure that the encapsulant 520 can flow into the channel 218.

Figure 4:
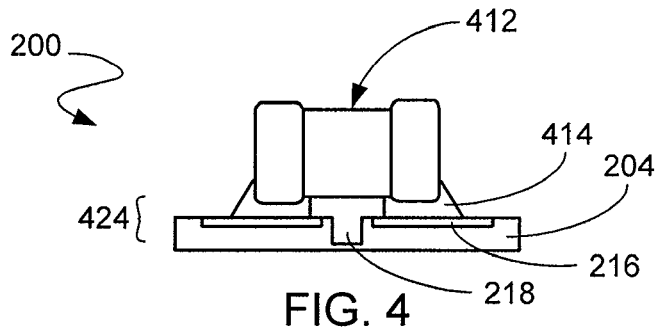
FIG. 4 is a cross sectional view of the simple integrated circuit package system of FIG. 2 after attachment of a discrete component.

Referring now to FIG. 4, therein is shown a cross sectional view of the simple integrated circuit package system 200, after further processing. The discrete component 412 has been attached to the passive component contact pads 216 with an electrically conductive adhesive 414. The electrically conductive adhesive 414 electrically connects the discrete component 412 to the substrate 204. The discrete component 412 is coupled across the passive component contact pads 216 in a direction such as an x-direction. The x-direction is defined as a line that connects the center of the passive component pads 216 that the discrete component 412 is coupled across. The channel 218 can he oriented in a y-direction which is defined as being perpendicular to the x-direction of the discrete component 412.

Figure 5:
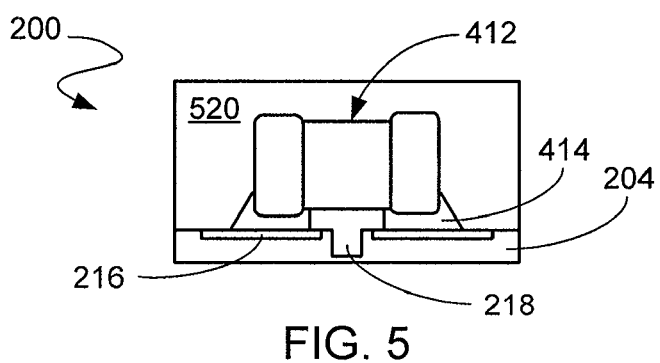
FIG. 5 is a cross sectional view of the simple integrated circuit package system as shown in FIG. 4 after encapsulation in an encapsulant.

Referring now to FIG. 5, therein is shown a cross-sectional view of the simple integrated circuit package system 200 after further processing. The encapsulant 520 has filled the channel 218 and encapsulated the passive component contact pads 216, the electrically conductive adhesive 414, and the discrete component 412.

Figure 6:
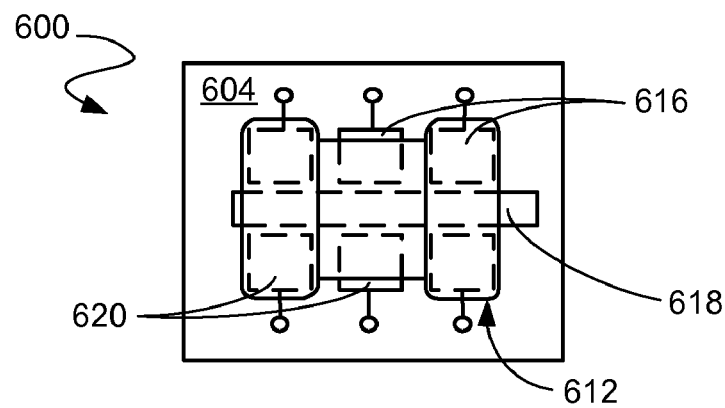
FIG. 6 is a plan view of an integrated circuit package system with more than two contact pads according to an alternate embodiment of the present invention.

Referring now to FIG. 6, therein is shown a plan view of an integrated circuit package system 600 according to an alternate embodiment of the present invention. A channel 618 extends between a number of first contact pads 616 and a number of second contact pads 620. The first contact pads 616 and the second contact pads 620 permit a discrete component 612, requiring more than two contact pads, to be attached to a substrate 604.

Figure 7:
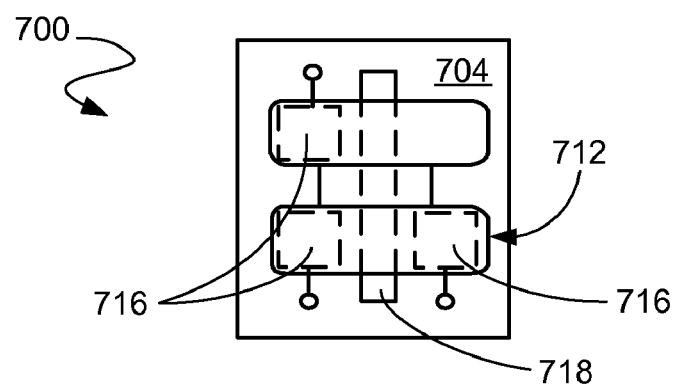
FIG. 7 is a plan view of an integrated circuit package system with an odd number of contact pads according to another alternate embodiment of the present invention.

Referring now to FIG. 7, therein is shown a plan view of an integrated circuit package system 700 according to an alternate embodiment of the present invention. In this embodiment, an odd number of contact pads 716 are offset from one another. The odd number of contact pads 716 permits a discrete component 712, requiring an odd number of contact pads, to be attached to a substrate 704.

Figure 8:
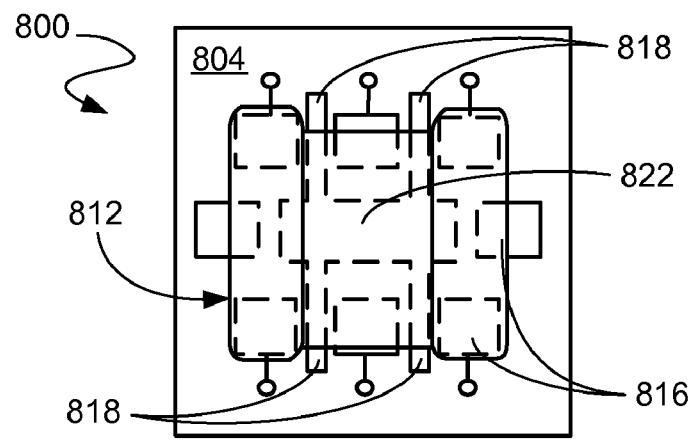
FIG. 8 is a plan view of an integrated circuit package system with multiple channels according to still another alternate embodiment of the present invention.

Referring now to FIG. 8, therein is shown a plan view of an integrated circuit package system 800 according to an alternate embodiment of the present invention. A number of channels 818 connect to a main channel 822. The channels 818 and the main channel 822 extend between a number of contact pads 816. The contact pads 816 permit a discrete component 812, requiring more than two contact pads, to be attached to the substrate 804. The channels 818 and the main channel 822 provide an increased volume under the discrete component 812 that aids in encapsulant flow.

FIG. 6, FIG. 7, and FIG. 8 are illustrative of the versatility of the invention, and any appropriate components could be selected, as needed or desired for a particular circuit design including, for example an inductor, resistor, capacitor, transistor, filter, diplexer, and saw filter.

Figure 9:
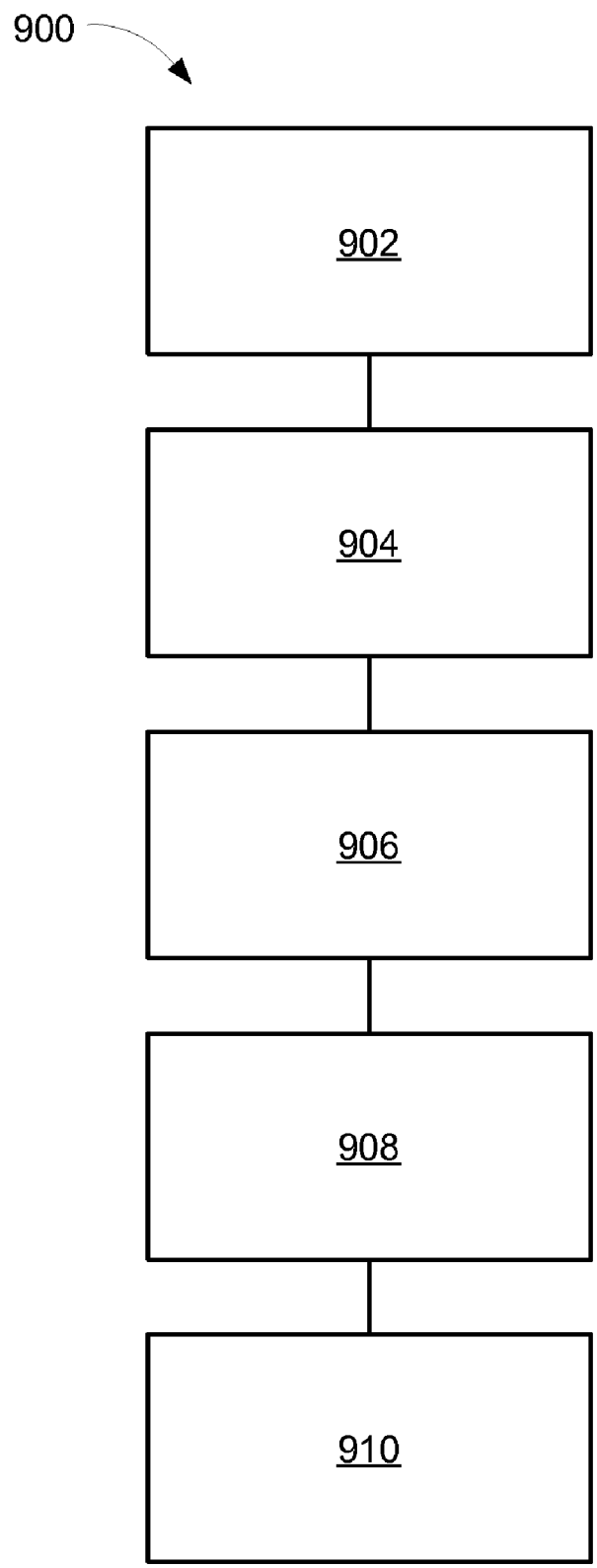
FIG. 9 is a flow chart of an integrated circuit package system according to an embodiment of the present invention.

Referring now to FIG. 9, therein is shown a flow chart of an integrated circuit package system 900 in accordance with an embodiment of the present invention. The integrated circuit package system 900 includes providing a substrate in a block 902; forming contact pads on the substrate in a block 904; forming a channel in the substrate between the contact pads in a block 906; electrically connecting a circuit component to the contact pads, with the circuit component over the channel, in a block 908; and encapsulating the circuit component, the contact pads, and the channel in encapsulant, the encapsulant flowing into the channel, in a block 910.

In greater detail, an integrated circuit package system, according to an embodiment of the present invention, is performed as follows:

1. The passive component contact pads 216 and the channel 218 are formed in the substrate 204. (FIG. 2) The channel 218 extends the first distance 326 and the second distance 328 beyond the passive component contact pads 216. (FIG. 3)
2. The discrete component 412 is attached to the passive component contact pads 216 with the electrically conductive adhesive 414. The electrically conductive adhesive 414 electrically connects the discrete component 412 to the substrate 204. (FIG. 4)
3. The encapsulant 520 fills the channel 218 and encapsulates the substrate 204, the passive component contact pads 216, the electrically conductive adhesive 414, and the discrete component 412. (FIG. 5)

It has been discovered that the present invention thus has numerous advantages. For example, the channel 218 prevents short circuits of the discrete component 412 by allowing the encapsulant 520 to enter the space between the passive component contact pads 216 and keep out the electrically conductive adhesive 414.

Another advantage of the present invention is that it economically and efficiently facilitates the continuing trend toward smaller and more compact IC devices and packages.

Yet another important advantage of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional advantages for preventing short circuits under discrete components. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of making an integrated circuit package system, comprising:
   providing a substrate, having active component contact pads on a first side;
   forming passive component contact pads in a discrete contact pair on the first side of the substrate beyond the active component contact pads;
   providing a circuit component coupled across the passive component pads in an x-direction;
   forming a channel, having a bottom, in the first side of the substrate between the passive component contact pads of the discrete contact pair, with the channel having a y-direction perpendicular to the x-direction and the channel having a first distance formed beyond the circuit component and a second distance shorter than the first distance formed beyond the circuit component;
   electrically connecting the circuit component to the passive component contact pads of the discrete contact pair, with the circuit component over the channel; and
   encapsulating the circuit component, first side of the substrate, the active component contact pads, the passive component contact pads, and the channel in an encapsulant, the encapsulant filling the channel and the space between the bottom and the circuit component.

2. The method of claim 1 further comprising:
   attaching an active component to the substrate; and
   electrically connecting the active component to the substrate at the active component contact pads.

3. The method of claim 1 wherein forming the channel includes forming the channel with the first distance in a first direction and the second distance in a second direction beyond the contact pads.

4. The method of claim 1 wherein forming the channel further comprises forming a plurality of channels that connect to a main channel.

5. The method of claim 1 wherein there are an odd number of contact pads.

6. A method of making an integrated circuit package system, comprising:
   providing a substrate, having active component contact pads on a first side;
   forming passive component contact pads in a discrete contact pair on the first side of the substrate beyond the active component contact pads;
   providing a discrete component coupled across the passive component pads in an x-direction;
   forming a channel, having a bottom, in the first side of the substrate between the passive component contact pads of the discrete contact pair, with the channel having a y-direction perpendicular to the x-direction and the channel having a first distance formed beyond the discrete component and a second distance shorter than the first distance formed beyond the discrete component;
   electrically connecting the discrete component to the passive component contact pads of the discrete contact pair with electrically conductive adhesive, with the discrete component over the channel; and
   encapsulating the discrete component, the first side of the substrate, the active component contact pads, the passive component contact pads, the electrically conductive adhesive, and the channel in encapsulant, the encapsulant filling the channel including the space between the bottom, the discrete component, and the electrically conductive adhesive.

7. The method of claim 6 further comprising:
   attaching an active component to the substrate with an adhesive; and
   electrically connecting the active component to the substrate at the active component contact pads with wires.

8. The method of claim 6 wherein forming the channel includes forming the channel with the first distance in a first direction and the second distance in a second direction beyond the passive component contact pads, the first distance not being equal to the second distance.

9. The method of claim 6 wherein forming the channel includes forming a bottom of the channel, and connecting the discrete component at a distance greater than 50 µm from the bottom of the channel.

10. The method of claim 6 wherein electrically connecting the discrete component includes the discrete component is an inductor, resistor, or capacitor.

11. An integrated circuit package system, comprising:
a substrate, having a channel and active component contact pads on a first side of the substrate, including passive component contact pads formed in a discrete contact pad beyond the active component contact pads and the channel between the passive component contact pads and the channel having a bottom;
a circuit component electrically connected to the passive component contact pads of the discrete contact pair, with the circuit component coupled in an x-direction over the substrate having the channel having a y-direction perpendicular to the x-direction and the channel having a first distance formed beyond the circuit component and a second distance shorter than the first distance formed beyond the circuit component; and
an encapsulant encapsulating the circuit component, first side of the substrate, the active component contact pads, the passive component contact pads, and the channel filled includes the space between the bottom and the circuit component.

12. The system of claim 11 further comprising:
an active component attached to the substrate; and
the active component electrically connected to the substrate at the active component contact pads.

13. The system of claim 11 wherein the substrate having the channel the first distance in a first direction and the second distance in a second direction beyond the circuit component contact pads.

14. The system of claim 11 wherein the substrate having the channel further comprises a plurality of channels that connect to a main channel.

15. The system of claim 11 wherein there are an odd number of contact pads.

16. The system of claim 11 wherein:
the circuit component is a discrete component;
electrically conductive adhesive electrically connects the discrete component to the passive component contact pads; and
the encapsulant fills the channel wherein the space between the bottom, the discrete component, and the electrically conductive adhesive is filled by the encapsulant.

17. The system of claim 16 further comprising:
an active component attached to the substrate with an adhesive; and
wires electrically connecting the active component to the substrate at the active component contact pads.

18. The system of claim 16 wherein the substrate having the channel includes the channel formed the first distance in a first direction and the second distance in a second direction beyond the passive component contact pads, the first distance not being equal to the second distance.

19. The system of claim 16 wherein the channel includes a bottom of the channel, and the discrete component connected at a distance greater than 50 µm from the bottom of the channel.

20. The system of claim 16 wherein the discrete component is a resistor, capacitor, or inductor.

* * * * *

UNITED STATES PATENT AND TRADEMARK OFFICE
CERTIFICATE OF CORRECTION

| | | |
|---|---|---|
| PATENT NO. | : 8,009,436 B2 | Page 1 of 1 |
| APPLICATION NO. | : 11/380652 | |
| DATED | : August 30, 2011 | |
| INVENTOR(S) | : Lee et al. | |

It is certified that error appears in the above-identified patent and that said Letters Patent is hereby corrected as shown below:

Column 3:
lines 7-9, delete "drawing FIGS. Similarly, although the views in the drawings for ease of description generally show similar orientations, this depiction in the FIGS. is arbitrary" and insert therefor --drawing FIGs. Similarly, although the views in the drawings for ease of description generally show similar orientations, this depiction in the FIGs. is arbitrary--

Column 4:
line 29, delete "The channel 218 can he oriented in a y-direction which is" and insert therefor --The channel 218 can be oriented in a y-direction, which is--

Signed and Sealed this
Twelfth Day of June, 2012

David J. Kappos
*Director of the United States Patent and Trademark Office*